United States Patent [19]

Matsumura et al.

[11] 4,412,237
[45] Oct. 25, 1983

[54] SEMICONDUCTOR DEVICE

[75] Inventors: Nobutake Matsumura, Tokyo; Ryusuke Hoshikawa, Sagamihara; Yoshihide Sugiura, Tokyo; Hiroaki Ichikawa, Yokohama; Syoji Sato, Sagamihara, all of Japan

[73] Assignee: Fujitsu Limited, Kawasaki, Japan

[21] Appl. No.: 143,472

[22] PCT Filed: Dec. 11, 1978

[86] PCT No.: PCT/JP78/00048
§ 371 Date: Aug. 29, 1979
§ 102(e) Date: Aug. 29, 1979

[87] PCT Pub. No.: WO79/00461
PCT Pub. Date: Jul. 26, 1979

[30] Foreign Application Priority Data

Dec. 30, 1977 [JP] Japan ................. 52-158445

[51] Int. Cl.$^3$ .............................. H01L 27/02
[52] U.S. Cl. ........................ 357/42; 357/45; 357/41
[58] Field of Search .......... 357/42, 23, 45, 41

[56] References Cited

U.S. PATENT DOCUMENTS

| | | | |
|---|---|---|---|
| 4,125,854 | 11/1978 | McKenny | 357/45 |
| 4,128,773 | 12/1978 | Troutman | 307/238 |
| 4,132,904 | 1/1979 | Harari | 357/42 |
| 4,144,561 | 3/1979 | Tu et al. | 354/45 X |
| 4,148,046 | 4/1979 | Hendrikson | 357/45 X |
| 4,161,662 | 7/1979 | Malcolm | 357/45 X |

Primary Examiner—Martin H. Edlow
Attorney, Agent, or Firm—Staas & Halsey

[57] ABSTRACT

Disclosed is a semiconductor device having a large number of basic cells, wherein a plurality of basic cells arranged along rows of a semiconductor substrate form a basic cell array and a plurality of the basic cell arrays are arranged along columns of the substrate, and further including spaces formed between each adjoining column. Each basic cell is comprised of first and second P-channel MIS transistors and first and second N-channel MIS transistors. The gates of both the first P-channel and the first N-channel MIS transistors form a first single common gate, and the gates of both the second P-channel and the second N-channel MIS transistors form a second single common gate. The sources or the drains of both the first P-channel and the second P-channel MIS transistors form a first single common source or drain, and the sources or the drains of both the first N-channel and the second N-channel MIS transistors form a second single common source or drain. Each of the first and second single common gates has two terminal electrodes at both sides of respective basic cell array and a central terminal electrode at the center of the respective basic cell array. Further, each of the basic cells includes a small space extending between both sides of the basic cell array, which space can be utilized as a field for distributing, along a row, interconnecting lines.

17 Claims, 19 Drawing Figures

SEMICONDUCTOR DEVICE

DESCRIPTION

Technical Field

The present invention relates to a semiconductor device and, more particularly, relates to a semiconductor device fabricated with a large number of large scale integrated CMIS (Complementary Metal Insulated Semiconductor) transistors, such as metal-oxide semiconductor transistors, arranged along both rows and columns of a semiconductor substrate.

Background Art

In recent years, a demand has arisen for fabrication of a large scale integrated semiconductor device which is suitable for low volume but wide variety manufacturing, without increasing the manufacturing cost and the manufacturing time. In response to this demand, the so-called masterslice semiconductor device has been proposed. In the masterslice semiconductor device, as is well known, first a large number of basic cells are formed on a single semiconductor substrate, however, no interconnecting lines formed therebetween or within each basic cell. Each of the basic cells is usually comprised of basic elements, such transistors, resistors and so on. A single semiconductor device comprised of only such basic cells is suitable for massproduction. After massproduction of the masterslice semiconductor device, the desired interconnecting lines between the basic cells and in each basic cell are then formed thereon by using a specified mask for wiring, in accordance with a variety of large scale integrated circuits to be fabricated for obtaining respective desired functional circuits.

In the masterslice semiconductor device, since the basic cells, each comprising transistors, resistors and so on are originally massproduced in the semiconductor substrate, a desired device can be completed by simply preparing a specified mask for forming the desired interconnecting lines every time a need for obtaining certain desired functional circuits occurs, and accordingly, a reduction of the manufacturing time can be achieved. Further, since the massproduced basic cells can be commonly utilized for obtaining any of the various kinds of functional circuits, a reduction of the manufacturing cost can be achieved. In addition, in the masterslice semiconductor device, since a large number of basic cells are regularly arranged along both rows and columns of the semiconductor substrate and form a standardized matrix pattern, it is very easy to employ the so-called computer aided automatic wiring operation for forming the interconnecting lines.

The above mentioned masterslice semiconductor device is disclosed, for example in the reports of the ISSCC 78/WEDNESDAY, Feb. 15, 1978/CONTINENTAL BALLROOM 4-5/4:15 PM and also ISSCC 78/WEDNESDAY, Feb. 15, 1978/CONTINENTAL BALLROOM 4-5/THAM 9.2. Generally, in the masterslice semiconductor device, there are several shortcomings. One shortcoming is that a high density of an integration can not be attained. This is because, each basic cell is isolated by spaces extending along rows and adjacent spaces extending along columns, and accordingly, the basic cells are scattered on the substrate. A second shortcoming is that interconnecting lines cannot be distributed uniformly on the substrate. This is because, firstly, the distribution of the interconnecting lines is carried out only in the spaces and, secondly, it is impossible to distribute the interconnecting lines on the basic cells, even if the cells are not to be used. Another shortcoming is that the densities of interconnecting lines at some portions of the spaces often become very high. This is because, each basic cell has only one input terminal electrode and one output terminal electrode. As mentioned above, a conventional masterslice semiconductor device lacks flexibility with regard to distribution of the interconnecting lines and, also, lacks capability of achieving a large integration of the basic cells.

DISCLOSURE OF INVENTION

An object of the present invention is, therefore, to provide a semiconductor device which has no shortcomings similar to the aforesaid shortcomings of the conventional masterslice semiconductor device, and accordingly, it is easy to obtain a high degree of flexibility with regard to the distribution of the interconnecting lines and there is a capability for achieving a large integration of basic cells.

According to the present invention, there is provided a semiconductor device having a large number of basic cells, wherein a plurality of basic cell arrays are arranged along a row of a substrate, and a plurality of the rows are arranged along a column of the substrate including spaces formed between each adjoining column. Each basic cell is comprised of first and second P-channel MIS transistors and first and second N-channel MIS transistors. The gates of both the first P-channel and the first N-channel MIS transistors form a first single common gate, while the gates of both the second P-channel and the second N-channel MIS transistors form a second single common gate. The sources or the drains of both the respective first P-channel and the second P-channel MIS transistors form a first single common source or drain, while the sources or the drains of both the respective first N-channel and the second N-channel MIS transistors form a second single common source or drain. Each of the first and second single common gates has two terminal electrodes at both sides of a corresponding column and has a central terminal electrode at the center of this column. Further, each of the basic cells includes a small space extending between both sides of the column which space can be utilized as an area for distributing, along a row, interconnecting lines.

BEST MODE FOR CARRYING OUT THE INVENTION

The present invention will become more apparent from the detailed description of the preferred embodiments presented below, with reference to the accompanying drawings.

Figure 1:
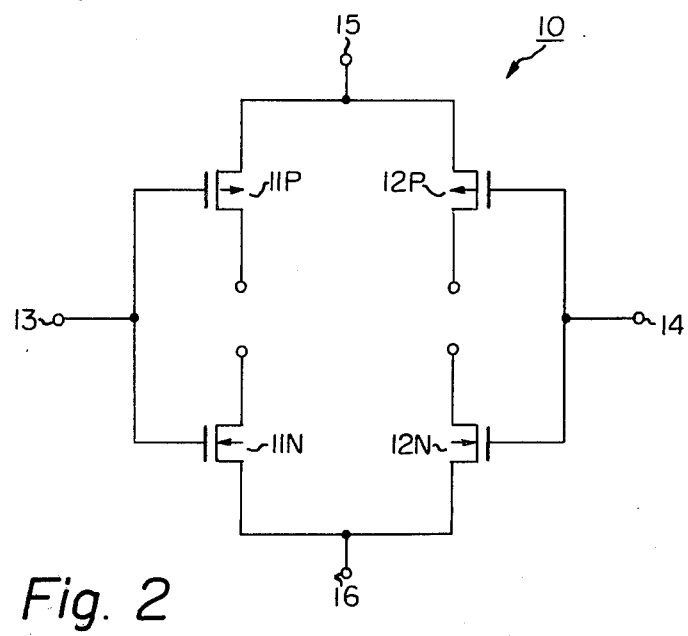
FIG. 1 is a circuit diagram of a basic cell according to the present invention.

Referring to FIG. 1, a circuit of a basic cell 10 of the present invention is comprised of two pairs of CMIS transistors, that is: a first P-channel MIS transistor 11P, a first N-channel MIS transistor 11N; a second P-channel MIS transistor 12P and a second N-channel MIS transistor 12N. The gates of the transistors 11P and 11N are connected to each other. The commonly connected gate terminal is designated by the reference numeral 13. Similarly, the gates of the transistors 12P and 12N are connected to each other. The commonly connected gate terminal is designated by the reference numeral 14. Further, either the source or the drain of the transistor 11P and either the source or the drain of the transistor 12P are combined with each other and connected to a common terminal 15. Similarly, either the drain or the source of the transistor 11N and either the source or the drain of the transistor 12N are combined with each other and connected to a common terminal 16.

The basic cell 10 having the circuit diagram shown in FIG. 1 may be formed on a semiconductor substrate in various ways. A unique way of forming this basic cell 10, according to the present invention, will be understood by referring to FIG. 2. It should be noted that in FIG. 2, the various kinds of hatchings indicate divisions of respective areas and not cross-sectional areas.

Figure 2:
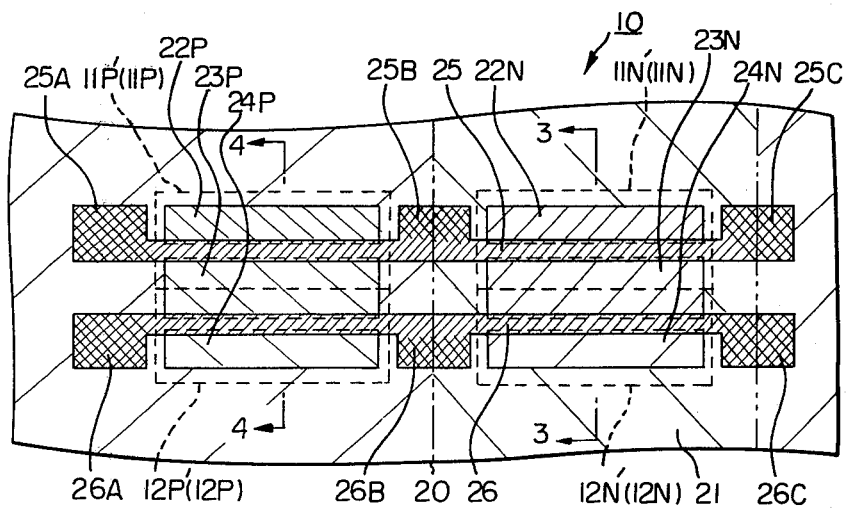
FIG. 2 is a top plan view of the basic cell formed on a semiconductor substrate, according to the present invention.

Referring to FIG. 2, the reference numeral 20 repesents an N-type semiconductor substrate. The substrate 20 may also be a P-type semiconductor substrate, if necessary. In the substrate 20, a P-well 21 is formed. In the P-well 21, the dotted line 11N' defines the area for forming the N-channel transistor 11N shown in FIG. 1. Similarly, the dotted line 12N' defines the area for forming the N-channel transistor 12N shown in FIG. 1. On the other hand, in the substrate 20, the dotted lines 11P' and 12P', respectively define the areas for forming the P-channel transistors 11P and 12P shown in FIG. 1. In the area enclosed by the dotted line 11N', areas 22N and 23N represent the source and drain of the transistor 11N. In the area enclosed by the dotted line 12N', an area 24N and said area 23N represent the source and drain of the transistor 12N. Accordingly, the area 23N is commonly occupied by both transistors 11N and 12N. These areas 22N, 23N and 24N are all N+-regions.

In the area enclosed by the dotted line 11P', areas 22P and 23P represent the source and drain of the transistor 11P. In the area enclosed by the dotted line 12P', an area 24P and said area 23P represent the source and drain of the transistor 12P. Accordingly, the area 23P is commonly occupied by both transistors 11P and 12P. These areas 22P, 23P and 24P are all P+-regions.

The reference numeral 25 represents a first gate which is a single common gate for both the transistors 11N and 11P. The first gate 25 is made of a polysilicon layer. The reference numeral 26 represents a second gate which is a single common gate for both the transistors 12N and 12P. The second gate 26 is also made of a polysilicon layer. The first gate 25 has terminal electrodes 25A and 25C at its ends and also a terminal electrode 25B at its center. Similarly, the second gate 26 has terminal electrodes 26A and 26C at its ends and also a terminal electrode 26B at its center.

The areas 22N, 23N and 24N are formed by an injection of N+ ions into the P-well 21 by utilizing, for example, a conventional ion implantation method or a solid-solid diffusion method. The areas 22P, 23P and 24P are formed by an injection of P+ ions into the substrate 20 by utilizing, for example, a conventional ion implantation method or a solid-solid diffusion method. The first and second gates 25 and 26, made of polysilicon layers, are made conductive by an ion injection simultaneously with the process for forming the areas 22N, 23N, 24N and 22P, 23P, 24P.

As seen from FIG. 2, the basic cell 10 is comprised of a pair of P-channel MIS transistors 11P and 12P, and a pair of N-channel MIS transistors 11N and 12N. The gates of the different channel transistors are formed as a single common gate. Either sources or drains of the same channel transistors are commonly formed as one body. The areas 22P, 23P, 24P and the areas 22N, 23N, 24N are arranged symmetrical to each other with respect to the terminal electrodes 25B and 26B. The first and second gates 25 and 26 are arranged symmetrical to each other with respect to the areas 23P and 23N. The first and second gates 25 and 26 are separated by a space so as to allow electrodes (not shown) of the areas 23P and 23N to be introduced into this space.

Figure 3:
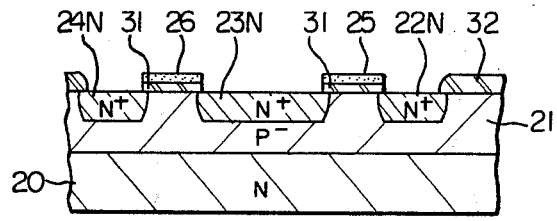
FIG. 3 is a cross-sectional view taken along a line 33 of the basic cell shown in FIG. 2.
Figure 4:
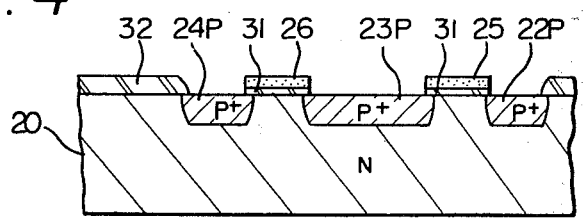
FIG. 4 is a cross-sectional view taken along a line 4—4 of the basic cell shown in FIG. 2.

Partial sectional views taken along the lines 3—3 and 4—4 in FIG. 2 are depicted in FIGS. 3 and 4, respectively. In both FIGS. 3 and 4, the reference numeral 31 represents a conventional gate oxide layer, made of silicon dioxide, and the reference numeral 32 represents a conventional field insulation layer, made of silicon dioxide. The members which are identical to members shown in FIG. 2 are designated by the same reference numerals and symbols as used in FIG. 2.

Figure 5:
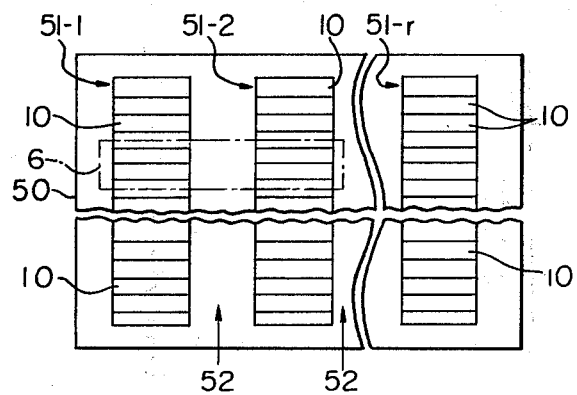
FIG. 5 is a top plan view of a special arrangement of the basic cells on a semiconductor chip, according to the present invention.

A layer number of basic cells 10 are arranged on a semiconductor chip with a special pattern such as shown in FIG. 5. In FIG. 5, the reference numeral 50 represents a semiconductor chip. On the semiconductor chip 50, a plurality of, for example, several hundred, basic cells 10 compose a basic cell array 51-1. Each basic cell 10 is arranged in the basic cell array 51-1 along rows of the chip 50. A plurality of identical cell arrays 51-1, 51-2 through 51-r, for example several tens of cell arrays, are arranged along columns of the chip 50. Each adjacent basic cell array includes spaces, such as spaces 52, therebetween, along columns of the chip 50. The spaces 52 are utilized for distributing interconnecting lines (not shown), for example several tens of interconnecting lines, to be distributed along respective columns. Spaces similar to the spaces 52, which must be located along rows of the chip 50, are not shown in FIG. 5. However, such spaces to be located along rows of the chip 50 are uniformly divided into small spaces and located in each basic cell. Each of these small spaces can be utilized for distributing several interconnecting lines to be distributed along respective rows.

Figure 6:
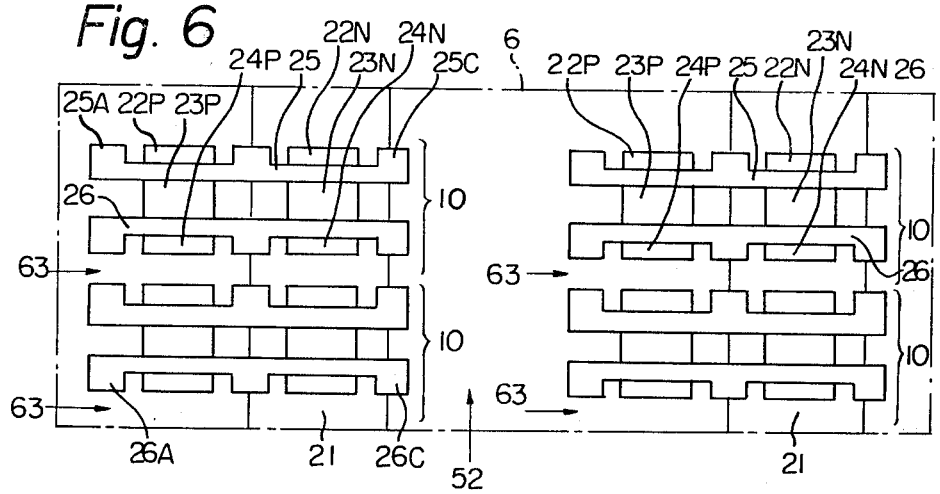
FIG. 6 is an enlarged top view of the partial semiconductor chip enclosed by a chain-dot line in FIG. 5.

The small spaces are illustrated in FIG. 6. FIG. 6 is an enlarged top view of the partial semiconductor chip 50 enclosed by a chain-dot line 6 in FIG. 5. In FIG. 6, the reference numeral 63 represents the aforesaid small space included in each basic cell 10. The small spaces 63 located on the same row, extend between both sides of the chip 50 (FIG. 5) by passing through the spaces 52. Thus, the interconnecting lines to be distributed along rows can be uniformly distributed over the entire top surface of the chip 50, and accordingly, the density of the interconnecting lines in any area on the chip 50 will be uniform. Similarly, the interconnecting lines to be distributed along the columns can also be uniformly distributed over the entire top surface of the chip 50, and accordingly, the density of the interconnecting lines in any area on the chip 50 will be uniform. This is because the interconnecting lines to be connected to the gates 25 and 26 can be distributed in the space 52 located either on left or right side of the respective basic cell 10 at will by utilizing either terminal electrode 25A or 25C (or 26A or 26C). If the density of interconnecting lines in the right space 52 is high, the interconnecting lines to be connected with the gates 25 and 26 may be distributed along the left space 52 by way of the terminal electrodes 25A and 26A, respectively. Thus, the semiconductor device fabricated by the semiconductor chip 50 has a high flexibility with regard to distribution of the interconnecting lines on the chip 50. Furthermore, since the conventional spaces arranged along the rows are divided into small spaces and inserted into respective basic cells, the basic cells 10 contained in each basic cell array are continuously arranged without any unwanted space between each adjacent basic cell. Consequently, a high integration of functional circuits can be attained with the semiconductor device fabricated by the chip 50.

Figure 7:
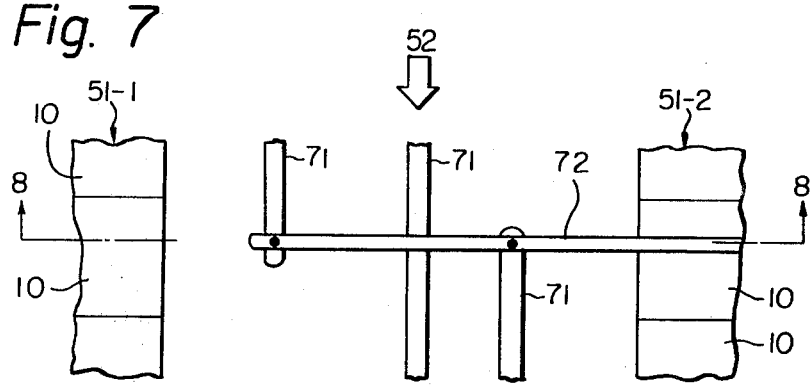
FIG. 7 is a top plan view of a partial arrangement of interconnecting lines distributed on the semiconductor chip, according to the present invention.
Figure 8:
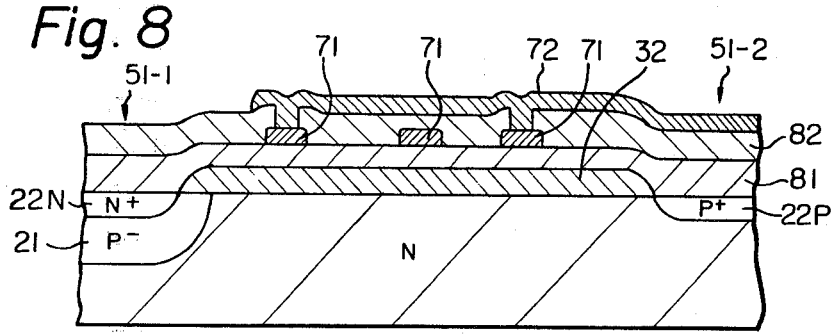
FIG. 8 is a cross-sectional view taken along a line 8—8 in FIG. 7.

In order to enable the distribution of the interconnecting lines along both the rows and columns on the semiconductor chip 5, it is necessary to form interconnecting line layers as multilayers. A first interconnecting line layer is used for distributing the interconnecting lines along columns. A second interconnecting line layer, located on the first interconnecting line layer, is used for distributing the interconnecting lines along rows. A construction of the above first and second interconnecting line layers will become apparent by referring to FIGS. 7 and 8. In FIG. 7, the interconnecting lines distributed along a column are designated by the numeral 71, and are located in the space 52 between, for example the basic cell arrays 51-1 and 51-2. One of the interconnecting lines distributed along a row is designated by the numeral 72. FIG. 8 is a cross-sectional view taken along a line 8—8 in FIG. 7. Both the N+-region 22N and the P-well 21 in the basic cell array 51-1 in FIG. 8 have been already described hereinbefore. Similarly, the P+-region 22P in the basic cell array 51-2 has been already described hereinbefore. The N-region forms the space 52. The aforesaid field insulation layer 32 is laid over the space 52. The first interconnecting line layer along a column is formed on a first insulation layer 81, made of a phosphosilicate glass. The first interconnecting line layer is comprised of the interconnecting lines 71, made of aluminum conductors, and is formed on the first insulation layer 81. The second interconnecting line layer along a row is formed on a second insulation layer 82, formed on the first insulation layer 81, which layer 82 is also made of a phosphosilicate glass. The second interconnecting line layer is comprised of the interconnecting line 72, made of an aluminum conductor. The portions where the interconnecting lines 71 and 72 are connected to each other, correspond to the portions represented by symbols "." in FIG. 7. Finally, in FIG. 8, a conventional passivation layer (not shown), made of a phosphosilicate glass, is formed on the entire top surface of the semiconductor chip.

Figure 9:
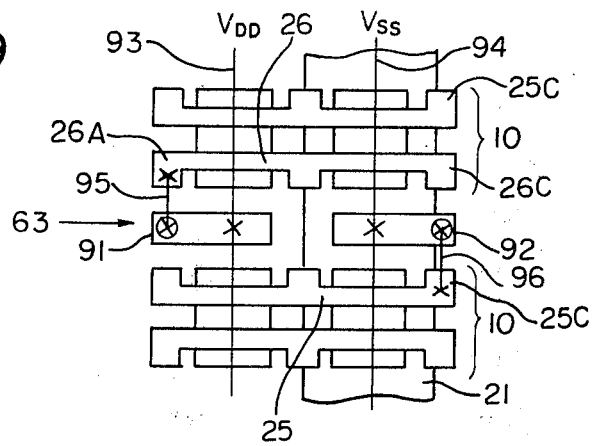
FIG. 9 is a top plan view of a voltage supply lines arranged over the basic cells, according to the present invention.

The inteconnecting lines distributed above the basic cells may be utilized, for example, in the following two ways. In one case, referring to FIG. 9, the interconnecting lines distributed along and over the basic cells are used as a first voltage supply line ($V_{DD}$) 93 and a second voltage supply line ($V_{SS}$) 94. The voltage level of the second voltage supply line 94 is a ground potential. Generally, both the first and second voltage $V_{DD}$ and $V_{SS}$ have to be applied to each basic cell 10. Therefore, an N+-region 91 and a P+-region 92 are formed in the space 63 (see FIG. 6) of each basic cell 10, according to the present invention. Then, the first voltage $V_{DD}$ and the second voltage $V_{SS}$ are applied to the N+-region 91 and the P+-region 92, respectively, by way of through-holes of the first insulation layer 81 (see FIG. 8), at portions represented by symbols "X", by means of so-called ohmic contact. In another case, if the second gate 26 is not connected to anything else, this gate 26 may be connected to the N+-region 91 by way of the terminal electrode 26A, an interconnecting line along a column 95 and a through-hole of the first insulation layer 81 (see 81), at portion respresented by a symbol "⊗", by way of ohmic contact. Similarly, if the first gate 25 is not connected to anything else, this gate 25 may be connected to the P+-region 92 by way of the terminal electrode 25C, an interconnecting line 96 along a column and a through-hole of the first insulation layer 81 (see FIG. 8), at portion represented by a symbol "⊗", by means of ohmic contact. Generally, as is well known, the CMIS transistor must not include a gate which is not connected to anything else because, if the CMIS transistor includes such a free gate, this CMIS transistor cannot work normally. Therefore, a certain voltage has to be supplied to such a free gate, as mentioned in the above described other case.

Figure 10:
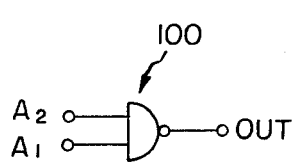
FIG. 10 is a typical logic symbol of a two-input NAND circuit.
Figure 11:
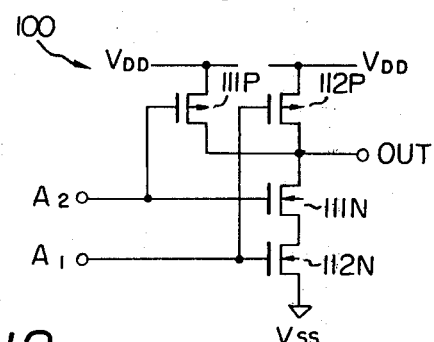
FIG. 11 is a circuit diagram of the construction of a NAND circuit comprised of only CMIS transistors.
Figure 12:
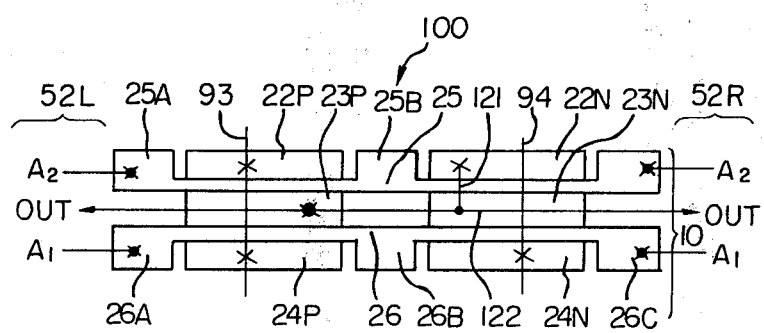
FIG. 12 is a top plan view of an arrangement of the basic cell and the interconnecting lines, which create the NAND circuit, according to the present invention.

In the semiconductor device, a desired functional circuit such as an AND circuit or a flip-flop circuit, can be completed by distributing appropriate interconnecting lines in each basic cell and between corresponding basic cells. The basic cells 10 of the present invention, are very useful for completing anyone of several tens of kinds of functional circuits. In a first example, a NAND circuit can be created on the following way, based on the basic cells of the present invention. FIG. 10 illustrates a typical logic symbol of a two-input NAND circuit. The NAND circuit 100 has two inputs $A_1$ and $A_2$ and one output OUT. When utilizing only CMIS transistors, the NAND circuit 100 can be constructed as shown in the circuit diagram in FIG. 11. In FIG. 11, transistors 111P and 112P comprise a pair of P-channel MIS transistors, and transistors 111N and 112N comprise a pair of N-channel MIS transistors. Symbols $V_{DD}$ and $V_{SS}$ have already been described with reference to FIG. 9. Symbols $A_1$, $A_2$ and OUT in FIG. 11 have the same meaning as the respective identical symbols in FIG. 10. The NAND circuit 100, which is formed according to the circuit diagram of FIG. 11, can be completed by distributing appropriate interconnecting lines on the basic cell of the present invention as will become apparent from FIG. 12. As seen in FIG. 12, the NAND circuit 100 is comprised of one basic cell 10, interconnecting lines 93, 94 and 121 along a column and interconnecting line 122 along a row. The interconnecting lines 93, 94 and 121 are formed on the first insulation layer 81 (see FIG. 8), and the interconnecting line 122 is formed on the second insulation layer 82 (see FIG. 8). The interconnecting line 93, that is the voltage supply line ($V_{DD}$), is connected to both the regions 22P and 24P at portions designated by symbols "X", respectively, via through-holes of the first insulation layer and by means of ohmic contacts. The interconnecting line 94, that is the voltage supply line ($V_{SS}$), is connected to the regions 24N at a portion represented by the symbol "X", via a through-hole of the first insulation layer and by means of ohmic contact. The interconnecting line 122, that is, the output of the NAND circuit 100, is connected to the region 22N by way of the interconnecting line 121. The line 121 is connected, at one end, to the line 122 at a portion represented by the symbol ".", via a through-hole of the second insulation layer. The line 121 is connected, at the other end, to the region 22N at portion designated by symbol "X", via through-hole of the first insulation layer and by means of ohmic contact. The line 122 is also connected, to the region 23P at a portion represented by the symbol "⊗", via a through-hole of the second insulation layer and a through-hole of the first insulation layer, aligned with each other, and by means of ohmic contact. It is important to note that, in FIG. 12, the output OUT can be directed to the desired one or both of the left space 52L and the right space 52R, located close to both sides of the basic cell 10 and along columns. Also, the inputs $A_1$ and $A_2$ can be introduced into the basic cell 10 from the desired one or both of the spaces 52L and 52R.

Figure 13:
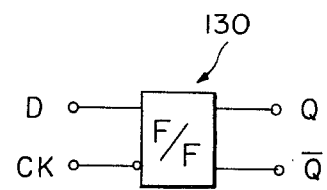
FIG. 13 is a typical logic symbol of a delayed flip-flop circuit.
Figure 14:
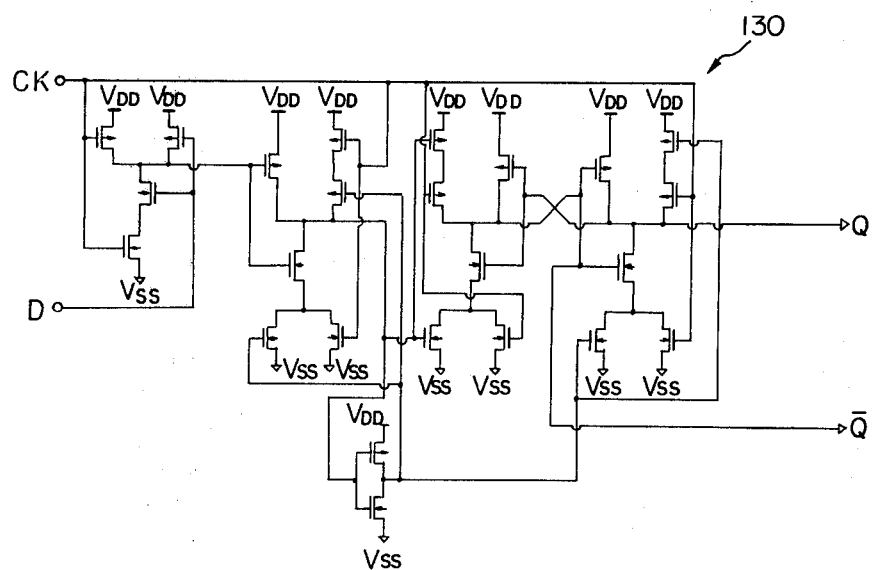
FIG. 14 is a circuit diagram of the construction of for constructing a delayed flip-flop circuit comprised of only CMIS transistors.
Figure 15:
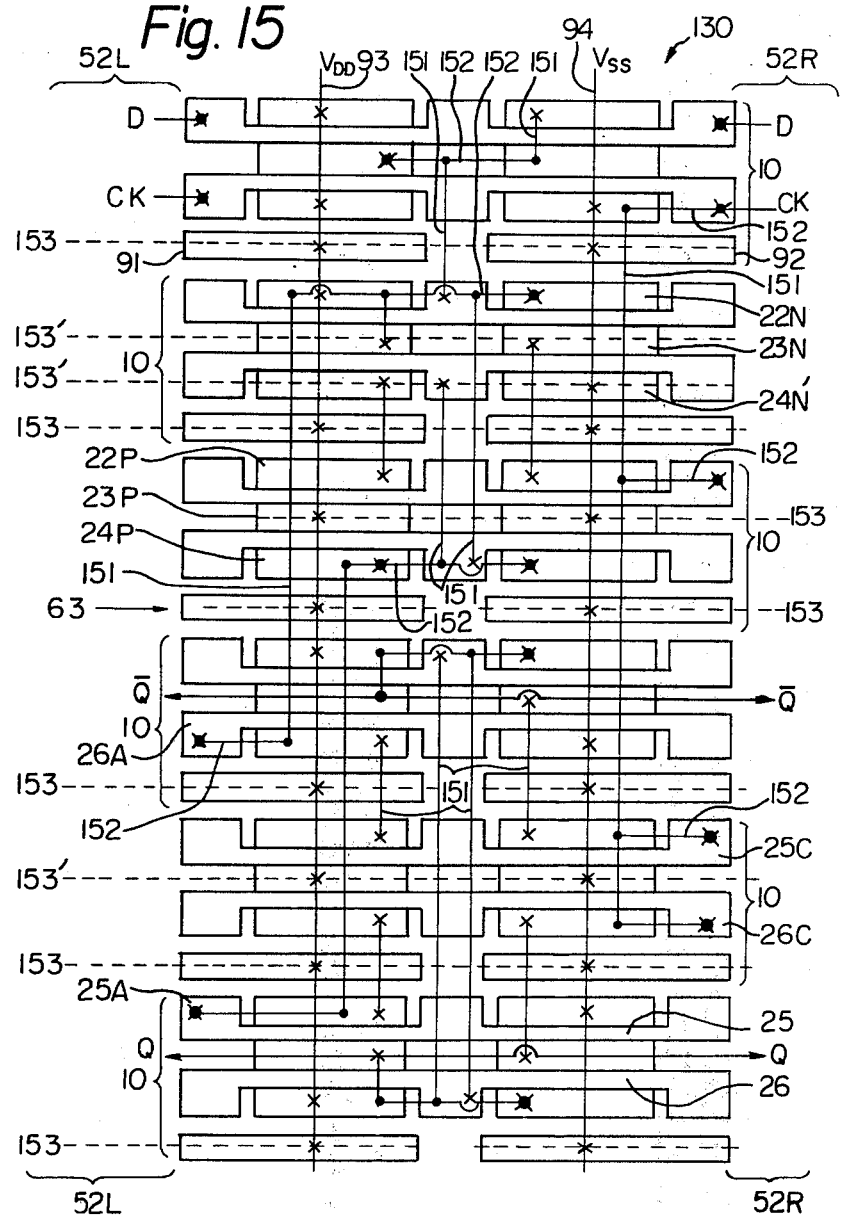
FIG. 15 is a top plan view of an arrangement of the baisc cells and the interconnecting lines, which create the delayed flip-flop circuit, according to the present invention.

In a second example, a delayed flip-flop circuit can be created in the following way, based on basic cells of the present invention. FIG. 13 is a typical logic symbol of the delay flip-flop circuit (F/F). The delayed flip-flop circuit 130 has an input D, an input CK (Clock), an output Q and an output $\overline{Q}$, which is an inverted output of the output Q. When utilizing only CMIS transistors, the delayed flip-flop circuit 130 can be constructed as shown in the circuit diagram of FIG. 14. In FIG. 14, the circuit 130 is comprised of fourteen CMIS P-channel transistors and fourteen CMIS N-channel transistors. The symbols $V_{DD}$ and $V_{SS}$ have been described with reference to FIG. 9, and the symbols CK, D, $\overline{Q}$ and Q have the same meaning as the respective identical symbols in FIG. 13. The delay flip-flop circuit 130, which is formed according to the circuit diagram of FIG. 14, can be completed by distributing appropriate interconnecting lines on the basic cells of the present invention, as will be apparent from FIG. 15. As seen in FIG. 15, the delayed flip-flop circuit 130 is comprised of six basic cells 10, the first voltage supply line ($V_{DD}$) 93 along a column, the second voltage supply line ($V_{SS}$) 94 along a column, interconnecting lines 151 along a column and interconnecting lines 152 along a row. The interconnecting lines 152 are formed on the second insulation layer 82 (see FIG. 8) and along respective rows. The remaining interconnecting lines 93, 94, 151 and also the first and second voltage supply lines 93, 94 are formed on the first insulation layer 81 (see FIG. 8) and along respective columns. The portions where the interconnecting lines along columns and the interconnecting lines along rows should be connected to each other, are represented by the symbols "⊗". The portions where the interconnecting lines should be in ohmic contact with the basic cell members, that is, the regions 22P, 23P, 24P, 22N 23N, 24N, the terminal electrodes 25A, 25B, 25C, 26A, 26B, 26C, the N+-regions 91 and P+-regions 92, via respective through-holes of the first and second insulation layers, are represented by symbols "X" or " ". It is important to note that, in FIG. 15, the outputs Q and $\overline{Q}$ can be directed to the desired one or both of the left space 52L and the right space 52R, located close to both sides of each basic cell 10 and along columns. Also, the inputs D and Ck can be introduced into the corresponding basic cell 10 from the desired one or both of the spaces 52L and 52R. Further, internal interconnecting lines are all formed directly above the basic cells 10 contained in the delayed flip-flop circuit 130. The internal interconnecting lines along a column and right above each basic cell array, are arranged along a plurality of predetermined scale lines (not shown), each extending between the top of the semiconductor chip 50 (see FIG. 5) and the bottom thereof. In an embodiment of the present invention, there are fourteen predetermined scale lines, however, in FIG. 15 nine kinds of internal interconnecting lines are illustrated positioned at respective scale lines. On the other hand, the internal interconnecting lines along a row and across each basic cell array are also arranged along predetermined scale lines (not shown), each extending from the left side of the semiconductor chip 50 (see FIG. 5) to the right side thereof. Among the previously mentioned small spaces (see small spaces 63 in FIG. 6), the small spaces represented by the reference numeral 153 are not utilized for distributing internal interconnecting lines along rows which form the delayed flip-flop circuit 130. Accordingly, external interconnecting lines extending from the space 52L to the space 52R can be distributed on the respective small spaces 153. These external interconnecting lines along rows are formed on the second insulation layer. Small spaces which are not corresponding to the small spaces 63 (see FIG. 6) and are not utilized as the internal interconnecting lines, are represented by the reference numeral 153' in FIG. 15. These small spaces 153' are also utilized for distributing the external interconnecting lines along rows. These external interconnecting lines are located on the second insulation layer. In FIG. 15, the inputs D, CK and the outputs Q, $\overline{Q}$ are all treated only on the second insulation layer.

Functional circuits other than the above mentioned NAND circuit and delay flip-flop circit can also easily be fabricated by utilizing one or more basic cells 10 of the present invention. Thus, the basic cells 10 of the present invention are useful for basic cells of the masterslice semiconductor chip.

As previously mentioned, the masterslice semiconductor device comprised of the basic cells of the present invention can attain a high integration of functional circuits. This is because many functional circuits can be arranged continuously without forming unwanted space between adjacent functional circuits, on each basic cell array, leaving a minimum number of non-used basic cells therein.

Figure 16:
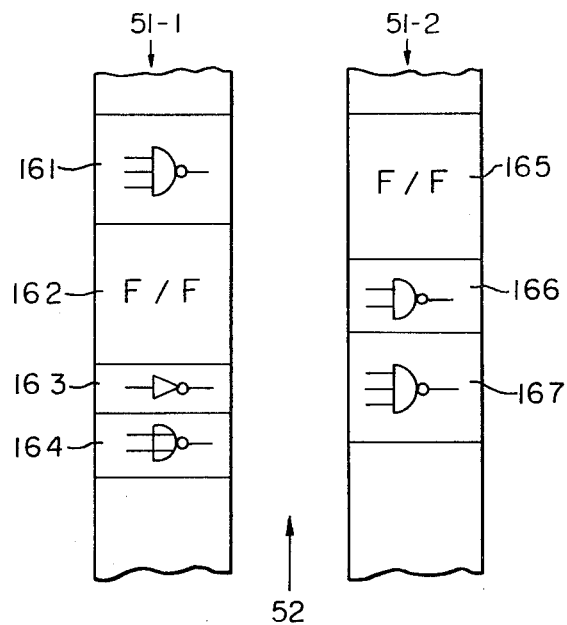
FIG. 16 schematically illustrates an arrangement of functional circuits formed on the basic cell arrays, according to the present invention.

FIG. 16 schematically illustrates an arrangement of functional circuits, for example, NAND circuits, NOR circuit, an inverter circuit and flip-flop circuits, which are formed on the basic cell arrays. On the basic cell array 51-1, a three-input NAND circuit 161, a flip-flop circuit 162, an inverter circuit 163 and a two-input NOR circuit 164 are arranged continuously. On the basic cell array 51-2, a flip-flop circuit 165, a two-input NAND circuit 166 and a three-input NAND circuit 167 are arranged continuously. Next, appropriate interconnecting lines are connected between two or more functional circuits to obtain a desired large scale integrated semiconductor circuit.

Figure 17:
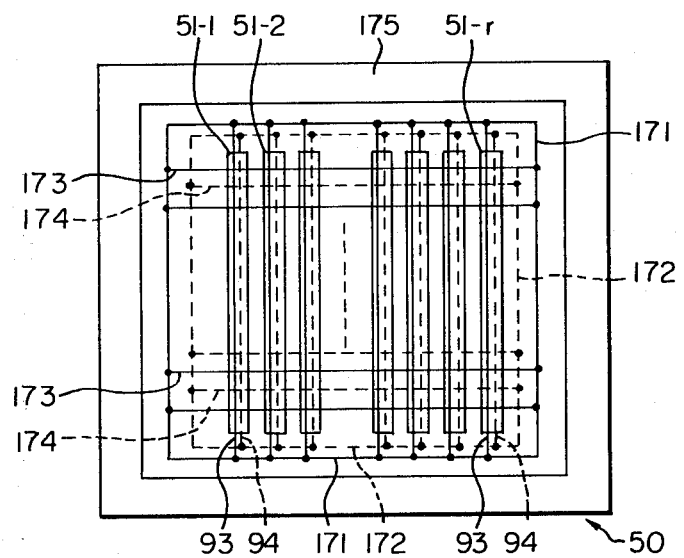
FIG. 17 is a top plan view of an arrangement of potential equilizing lines located above the basic cell arrays, according to the present invention.
Figure 18:
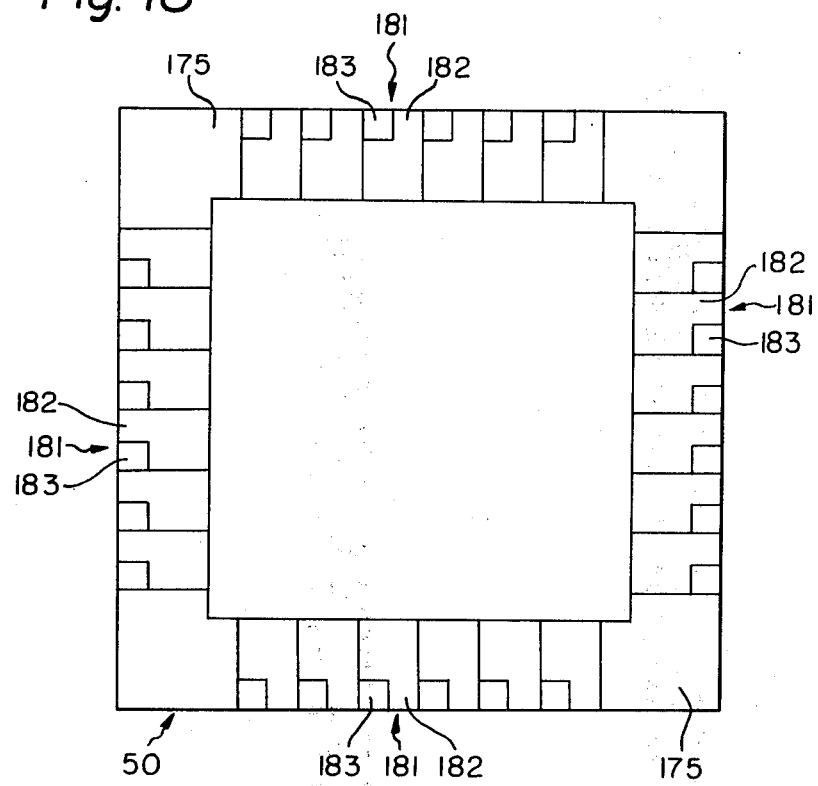
FIG. 18 schematically illustrates a top plan view of members mounted on a periphery area 175 shown in FIG. 17.

Returning again to FIGS. 9, 12 and 15, the first and seocnd voltage supply lines 93 and 94 extend along columns and across each basic cell array between the top and bottom thereof. Therefore, the length of each voltage supply line becomes quite long, and accordingly, the voltage drop along each voltage supply line becomes relatively high. In order to reduce the voltage drop, it is preferable to introduce potential equalizing lines. Potential equalizing lines are illustrated in FIG. 17. In FIG. 17, each of the basic cell arrays 51-1, 51-2 through 51-r contains the aforesaid first voltage supply line ($V_{DD}$) designated by a solid line 93, and the aforesaid second voltage supply line ($V_{SS}$), designated by a dotted line 94. The first voltage supply lines 93 are connected, at their respective ends, to a first voltage source, designated by a solid line 171. The second voltage supply lines 94 are connected, at their respective ends, to a second voltage source, designated by a dotted line 172. The first potential equalizing lines are designated by solid lines 173 and are connected, at their respective ends, to the first voltage source 171 via respective through-holes of the second insulation layer 82 (see FIG. 8). The second potential equalizing lines are designated by dotted lines 174 and are connected, at their respective ends, to the second voltage source 172 via respective through-holes of the second insulation layer 82 (see FIG. 8). Thus, the specified first and second voltage supply levels are applied, with very low voltage drop, to all of the basic cells regardless ofthe position thereof in the semiconductor chip. The potential equalizing lines are provided in, for example every ten basic cells 10 along columns. The reference numeral 175 represents a periphery field for mounting conventional members such as interface circuits and input/output electrode pads. Such conventional interface circuits and input/output electrode pads are mounted in the periphery field 175 in an arrangement as schematically illustrated in FIG. 18. In FIG. 18, the reference numeral 181 represents a conventional input/output macro configuration. Each input/output macro configuration 181 is comprised of a device area 182 and an input/output electrode pad area 183. The device area 182 is made up of devices such as transistors, film resistors (not shown). These devices form respective input/output buffer circuits cooperating with corresponding functional circuits comprised of transistors. The input/output buffer circuits are, for example, a three-state output/input buffer circuit, a three-state output buffer circuit, a true output buffer circuit and a true input buffer circuit. Connections between the macro configurations 181 and external circuit or device (but not shown) are completed by utilizing conventional lead wires via respective input/output electrode pads of the areas 183.

Figure 19:
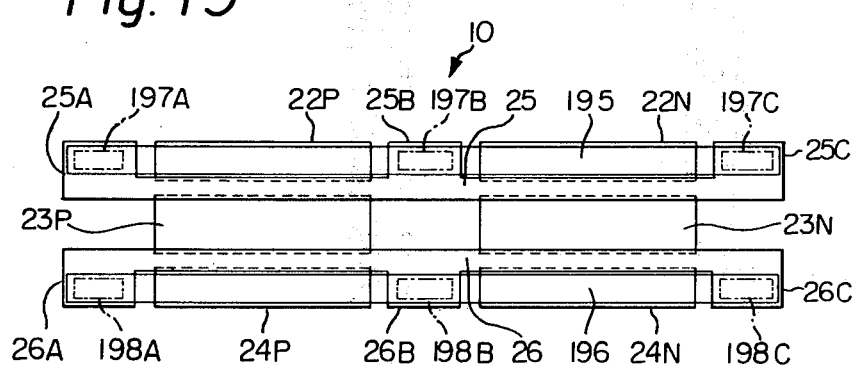
FIG. 19 is a top plan view of metal layers located above the basic cell.

Regarding the aforesaid first and second gates 25 and 26, illustrated in FIGS. 2, 6, 9, 12 and 15, the length of the first gate 25 along a row and, also, the length of the second gate 26 along a row, is relatively long. This is because these gates extend, along a row, between both sides of each basic cell 10, across the P-channel and N-channel transistors 11P, 11N and 12P, 12N (see FIG. 2). Since the length of each gate is relatively long and, in addition, since each gate is made of a polysilicon layer, the resistance value of each gate is very high. Therefore, a means for reducing the resistance value across the polysilicon layer is necessary. Such means for reducing the resistance value can be realized by a metal layer, made of, for example an aluminum conductor, according to the present invention. In FIG. 19, which is a top plan view of the basic cell 10, the metal layers are designated by the numerals 195 and 196. The metal layer 195 is located above and along the first gate 25. Preferably, the metal layer 195 extends along a row via portions directly above the terminal electrodes 25A, 25B and 25C. The metal layer 196 is located above and along the second gate 26. Preferably, the metal layer 196 extends along a row via portions directly above the terminal electrodes 26A, 26B and 26C. The resistance value across the first gate 25 can be reduced by connecting the metal layer 195 with the terminal electrodes 25A, 25B and 25C, by way of contacts represented by chain dotted lines 197A, 197B and 197C, via respective through-holes of the first and second insulation layers 81 and 82 (see FIG. 8). Similarly, the resistance value across the second gate 26 can be reduced by connecting the metal layer 196 with the terminal electrodes 26A, 26B and 26C, by way of contacts represented by chain dotted lines 198A, 198B and 198C, via respective through-holes of the insulation layers 81 and 82. The metal layers 195 and 196 formed on the second insulation layer 82 may be located directly above the first and second gates 25 and 26, respectively. However, in such case, the width of the gap between the metal layers 195 and 196 becomes small and accordingly, the interconnecting line 122 (see FIG. 12) formed between the gates 25 and 26 (see FIG. 12) is very close to both metal layers 195 and 196. The arrangement wherein the above mentioned interconnecting line 122 and the metal layers 195, 196 have with very small gaps therebetween is not practical for manufacturing the semiconductor chip, or for obtaining good electric characteristics, because unwanted interference will occur therebetween. The metal layers 195 and 196 are introduced into only the basic cells which compose the functional circuits.

If the first and second gates are made of metal layers, the metal layers 195 and 196 will not be necessary. In this case, the first and second gates have to be made of refractory metal layers.

As explained above, the semiconductor device of the present invention has the following advantages. Firstly, each basic cell array can contain a large number of the basic cells, because each basic cell is comprised of a pair of CMIS transistors and accordingly, is very small in size. Secondly, the LSI circuit fabricated by the semiconductor device has high integration of functional circuits, because each basic cell array can contain a large number of the basic cells. Thirdly, the functional circuit can be completed by internal interconnecting lines which are located directly above the basic cells for forming the corresponding functional circuit, while external interconnecting lines can be located not only directly above the used basic cells but also directly above the non-used basic cells. Accordingly, a high integration of the functional circuits can be attained. Lastly, the semiconductor device provides flexibility in distributing the interconnecting lines, because the gates of each basic cell face both sides of the basic cell. Also, the sources and drains of CMIS transistors can contact both interconnecting lines distributed on and along both sides of the basic cell. Further each interconnecting line along a row is distributed above one of the small spaces which are contained in all the basic cells.

We claim:

1. A semiconductor device having a large number of basic cells on a semiconductor substrate, the basic cells being arranged along rows and columns of the semiconductor substrate, characterized in that each said basic cell is comprised of a first P-channel MIS transistor, a first N-channel MIS transistor, a second P-channel MIS transistor and a second N-channel MIS transistor, wherein the gates of the first P-channel and N-channel MIS transistors are commonly connected to each other by the same electrode material, the gates of the second P-channel and N-channel MIS transistors are commonly connected to each other by the same electrode material, the sources or the drains of both the first and second P-channel MIS transistors occupy a single P-type region and are connected to each other and the sources or the drains of both the first and second N-channel MIS transistors occupy a single N-type region and are connected to each other, interconnecting lines being distributed on the semiconductor substrate, said interconnecting lines being selectively distributed adjacent the basic cells, whereby a variety of functional circuits can be obtained by suitably utilizing one or more of the basic cells, wherein in each of the basic cells, the first and second common gates are arranged in parallel to each other and, at the same time, are extended from one side to the other side of the basic cell.

2. A semiconductor device as set forth in claim 1, wherein each of the gates has, at both ends, terminal electrodes and a center terminal electrode positioned between the two terminal electrodes.

3. A semiconductor device as set forth in claim 2, wherein each basic cell further includes a small space extending along a row, and the small space can contain several interconnecting lines.

4. A semiconductor device as set forth in claim 3, wherein a plurality of basic cells arranged along rows form a basic cell array, and a plurality of basic cell arrays are arranged along columns, each two adjacent basic cell arrays including a space therebetween, and the space can contain several tens of interconnecting lines, each extending along a column.

5. A semiconductor device as set forth in claim 4, wherein a first insulation layer is formed on the entire surface of the semiconductor substrate and a second insulation layer is formed on the entire top surface of the first insulation layer, and wherein the interconnecting lines extending along columns are formed on the first insulation layer, while the interconnecting lines extending along rows are formed on the second insulation layer.

6. A semiconductor device as set forth in claim 5, wherein the interconnecting lines which are located directly above the used basic cells are utilized for composing a desired functional circuit, while the areas positioned directly above the non-used basic cells are utilized for distributing the interconnecting lines.

7. A semiconductor device as set forth in claim 6, wherein at least one of the interconnecting lines extending along a column and directly above each basic cell array, is utilized as a voltage supply line to be connected to MIS transistors of the basic cells.

8. A semiconductor device as set forth in claim 7, wherein two interconnecting lines extending along a column and directly above each basic cell array, are, respectively, utilized as a first voltage supply line ($V_{DD}$) and a second voltage supply line ($V_{SS}$), the first voltage supply line being in contact with N+-regions cooperating with the first and second P-channel MIS transistors of the basic cells, respectively, and the second voltage supply line being in contact with P+-regions cooperating with the first and second N-channel MIS transistors of the basic cells, respectively.

9. A semiconductor device as set forth in claim 8, wherein both P+-region and N+-region are formed directly under said small space in each basic cell.

10. A semiconductor device as set forth in claim 6, wherein the interconnecting lines which are located in said spaces along columns and, also, the interconnecting lines which are located in said small spaces along rows, are utilized for electrically connecting the functional circuits with each other.

11. A semiconductor device as set forth in claim 8, wherein a plurality of first and second potential equalizing lines are formed above the semiconductor substrate and along rows thereof, each of the first potential equalizing lines being connected, on one hand, to a first voltage supply source and on the other hand, to each of said first voltage supply lines via through-holes, while each of the second potential equalizing lines is connected, on one hand, to a second voltage supply source and, on the other hand, to each of said second voltage supply lines via through-holes, the first and second voltage supply lines and the first and second potential equalizing lines thus forming a matrix pattern of lines.

12. A semiconductor device as set forth in claim 5, wherein the first and second gates are made of polysilicon layers.

13. A semiconductor device as set forth in claim 5, wherein the first and second gates are made of refractory metal layers.

14. A semiconductor device as set forth in claim 12, wherein first and second metal layers are formed above and along the first and second gates, respectively.

15. A semiconductor device as set.forth in claim 14, wherein the first and second metal layers are connected to said terminal electrodes of respective first and second gates.

16. A semiconductor device as set forth in claim 1, wherein each basic array, provided with a plurality of basic cells arranged along rows, includes function circuits which are comprised of a single or a plurality of basic cells, the function circuits being arranged along rows.

17. A semiconductor device as set forth in claim 1, wherein basic cell arrays of a plurality of basic cells are arranged along columns, said basic cell arrays including functional circuits comprised of a single basic cell or a plurality of basic cells, said functional circuits being arranged along columns.

* * * * *

UNITED STATES PATENT AND TRADEMARK OFFICE
CERTIFICATE OF CORRECTION

PATENT NO.   : 4,412,237
DATED        : October 25, 1983
INVENTOR(S)  : MATSUMURA ET AL.

It is certified that error appears in the above-identified patent and that said Letters Patent is hereby corrected as shown below:

```
Column 5, line 57, "5," should be --50,--.
Column 8, line 17, ""●"" should be --.--;
          line 24, "" "" should be --"✗"--.
Column 12,line 44, "5" should be --2--;
          line 47, "5" should be --2--.
```

Signed and Sealed this

First Day of May 1984

[SEAL]

Attest:

GERALD J. MOSSINGHOFF

Attesting Officer       Commissioner of Patents and Trademarks